United States Patent
Baitz

(10) Patent No.: US 6,638,102 B1
(45) Date of Patent: Oct. 28, 2003

(54) DEVICE ARRANGEMENT WITH A STRUCTURAL COMPONENT MOUNTED IN A HOUSING

(75) Inventor: Günter Baitz, Berlin (DE)

(73) Assignee: Wincor Nixdorf GmbH & Co. KG., Paderborn (DE)

( * ) Notice: Subject to any disclaimer, the term of this patent is extended or adjusted under 35 U.S.C. 154(b) by 0 days.

(21) Appl. No.: 10/019,820

(22) PCT Filed: May 11, 2000

(86) PCT No.: PCT/DE00/01509

§ 371 (c)(1),
(2), (4) Date: Dec. 21, 2001

(87) PCT Pub. No.: WO01/03480

PCT Pub. Date: Jan. 11, 2001

(30) Foreign Application Priority Data

Jun. 30, 1999 (DE) .......................... 199 30 143

(51) Int. Cl.⁷ .................................................. H05K 5/04
(52) U.S. Cl. ........................ 439/532; 361/816; 439/571
(58) Field of Search ................................. 439/532, 533, 439/536, 567, 569, 571, 572, 341, 95; 361/600, 679, 715, 753, 610, 818, 816; 174/35 GL, 50

(56) References Cited

U.S. PATENT DOCUMENTS

| 4,731,702 A | | 3/1988 | Hiatt et al. ................. 361/391 |
| 4,777,565 A | * | 10/1988 | McIntosh .................... 361/816 |
| 5,145,406 A | * | 9/1992 | Knoll ......................... 439/532 |
| 5,249,979 A | | 10/1993 | Deinhardt et al. .......... 439/341 |

FOREIGN PATENT DOCUMENTS

| DE | 36 03 750 A1 | 8/1987 |
| DE | 196 10 559 A1 | 9/1997 |
| DE | 196 12 843 A1 | 10/1997 |
| DE | 297 20 810 U1 | 3/1998 |
| DE | 197 44 662 C1 | 6/1999 |

\* cited by examiner

Primary Examiner—Renee Luebke
(74) Attorney, Agent, or Firm—McCormick, Paulding & Huber LLP

(57) ABSTRACT

Device arrangement with a subassembly retained in a housing. A arrangement comprising a housing and a subassembly (10) which is retained in a releasable manner in the housing on an installation wall (12) is characterized in that the subassembly (10) is suspended on the installation wall (12) by means of a hook-like mounting element (36) and is pressed against the installation wall (12), and retained in its position, by a cover panel.

9 Claims, 2 Drawing Sheets

DEVICE ARRANGEMENT WITH A STRUCTURAL COMPONENT MOUNTED IN A HOUSING

Figure 1:
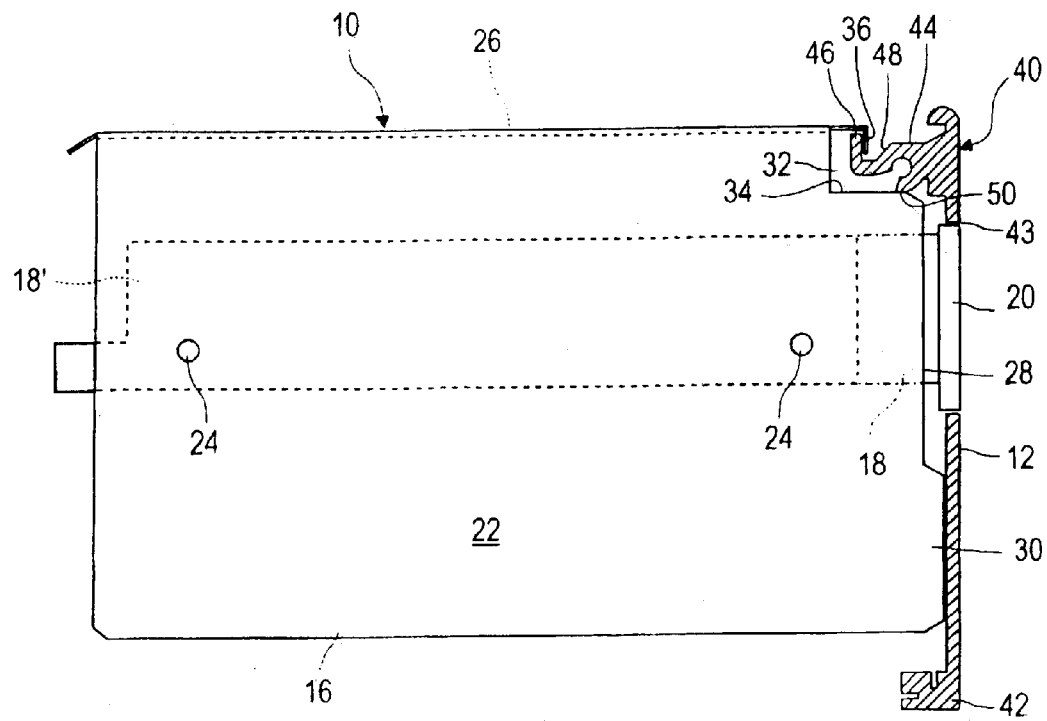

The invention relates to a device arrangement which comprises a housing and a subassembly which is retained in a releasable manner in the housing on an installation wall. It takes U.S. Pat. No. 4,731,702 A as its departure point.

Device arrangements of the above mentioned type are known, inter alia, as personal computers (PCs). For example, German Utility Model DE 297 20 810 U1 discloses a cuboidal housing in which the actual data processor of a PC is accommodated. Various peripheral devices, namely a chip-card reader, a floppy-disk drive and a ticket printer are installed in the front wall of the housing. Provided for this purpose in the front wall in each case is an introduction compartment, into which it is also possible to push a hard-disk drive. The task of installing a peripheral device in the introduction compartment is laborious because it is necessary, often with the interposition of spacers or guide strips, for screws to be screwed into threaded holes of the peripheral device through the side walls of the introduction compartment in constricted space conditions. Space-related problems also arise when the data and power supply cables are plugged onto corresponding plugs of the peripheral device.

DE 36 03 750 A1 describes a programmable controller in the case of which a row of assembly mounts is suspended on a mounting rail and, by pivoting against the mounting rail, are locked thereon with the aid of a spring-loaded locking element. It is difficult to release the subassembly mount from the mounting rail because the locking element is difficult to reach. It is possible to position on the subassembly mounts subassemblies which, for this purpose, are provided with pivot pins on both sides. Once the pivot pins have been fitted into grooves arranged on the subassembly mount, the subassemblies can be pivoted about said pins. A screw retains the subassemblies in a position in which they are pivoted onto the respective subassembly mount.

The object of the invention is to propose a device arrangement which allows a subassembly to be installed straightforwardly on an installation wall.

U.S. Pat. No. 4,731,702 A has thus already proposed a device arrangement which comprises a housing, with an opening which can be closed by a cover panel, and a subassembly which is retained in a releasable manner in the housing on an installation element which passes through the housing and is designed as an installation bar. The subassembly is suspended on the installation bar by means of a hook-like mounting element and is retained in its position by the cover panel. The cover panel and the housing consist, at least in a sub-region of an electrically conductive or conductively coated material. In the abovementioned position, a mechanical and electrical connection is produced between the subassembly and the housing with the aid of the cover panel, by stubs located on the cover panel engaging in complementary recesses of the subassembly.

A device arrangement according to the invention comprises a housing and a subassembly which is retained in a releasable manner in the housing on an installation wall, it being the case that the subassembly is suspended on an installation wall by means of a hook-like mounting element and is pressed against the installation wall, and retained in its position, by a cover panel. This allows the subassembly to be installed without the use of tools or fastening means. The spatial limitations for the installation of the connection cables are also dispensed with because the cables can easily be connected to the subassembly in the pivoted-up state (FIG. 2). It is only then that the subassembly is pivoted into its position in which it butts against the installation wall (FIG. 1), and is retained in this position with the aid of the cover panel.

According to the invention, on one side the housing has an opening which can be closed by the cover panel the installation wall has a mounting edge in the vicinity of the opening, and—as seen in the installed state of the subassembly—the mounting element is provided, on a side of the subassembly which is directed toward the installation wall, with a channel which engages over the mounting edge. Furthermore arranged on the subassembly, beneath the mounting element, is a supporting element which, in the installed state of the subassembly, butts against the installation wall. In its position in which it closes the opening, the cover panel subjects the subassembly to an elastic pressure-exerting torque which presses the supporting element against the installation wall, and the cover panel can be locked to the housing.

The spatial arrangement of the mounting edge of the installation wall in the vicinity of the housing opening facilitates the suspension of the subassembly to a particular extent. For this purpose, the latter is simply suspended on the mounting edge with the aid of the channel of the mounting element. In the installed position of the subassembly, the supporting element butts against the installation wall. If the cover panel is then moved into its position in which it closes the housing opening, and is locked in this position the subassembly, and thus the supporting element, is pressed against the installation wall.

It is advantageous for an electrical connection to be produced between the subassembly and the likewise conductive housing by the cover panel at the same time as the abovementioned retaining function. This is achieved in that the cover panel and the housing are produced, at least in a region of mutual contact, from an electrically conductive or conductively coated material. This ensures a reliable connection between the subassembly and the potential of the housing. The subassembly is thus fixed in captive fashion at its installation location and, as has been mentioned, is electrically connected, at the same time, to the cover panel and the housing.

A preferred embodiment of the device arrangement is characterized in that, on one side, the housing has an opening which can be closed by the cover panel, in that the cover panel can be locked to the housing, in that the installation wall has a mounting edge in the vicinity of the opening, in that—as seen in the installed state of the subassembly—the mounting element is provided, on a side of the subassembly which is directed toward the installation wall, with a channel which engages over the mounting edge, in that arranged on the subassembly, beneath the mounting element, is a supporting element which, in the installed state of the subassembly, butts against the installation wall, and in that, in its position in which it closes the opening, the cover panel subjects the subassembly to an elastic pressure-exerting torque which presses the supporting element against the installation wall.

The spatial arrangement of the mounting edge of the installation wall in the vicinity of the housing opening facilitates the suspension of the subassembly to a particular extent. For this purpose, the latter is simply suspended on the mounting edge with the aid of the channel of the mounting element. In the installed position of the subassembly, the supporting element butts against the installation wall. If the cover panel is then moved into its position in which it closes the housing opening, and is locked in this position, the subassembly, and thus the supporting element, is pressed against the installation wall. It is thus fixed in captive fashion at its installation location and, as has been mentioned, is electrically connected, at the same time, to the cover panel and the housing.

For connection to the housing, a first edge of the cover panel is retained at the top border of the installation wall. This preferably takes place in that the first edge of the cover panel is plugged beneath a retaining rib, which runs parallel to the mounting edge, or into a groove, which runs parallel to the mounting edge.

According to a preferred development of the invention, the subassembly comprises an installation cage in which at least one peripheral device can be, or is, installed, and the mounting edge and/or the supporting element are/is fitted on the installation cage. In this way, all the mechanical stressing, e.g. the contact pressure of the cover panel on the subassembly and of the supporting element against the installation wall, is kept away from the actual peripheral device or the peripheral devices.

The installation wall is preferably in the form of a side wall of the housing, in particular the front wall thereof. This renders an additional wall superfluous.

The installation wall is preferably produced from a continuously cast profile.

Figure 2:
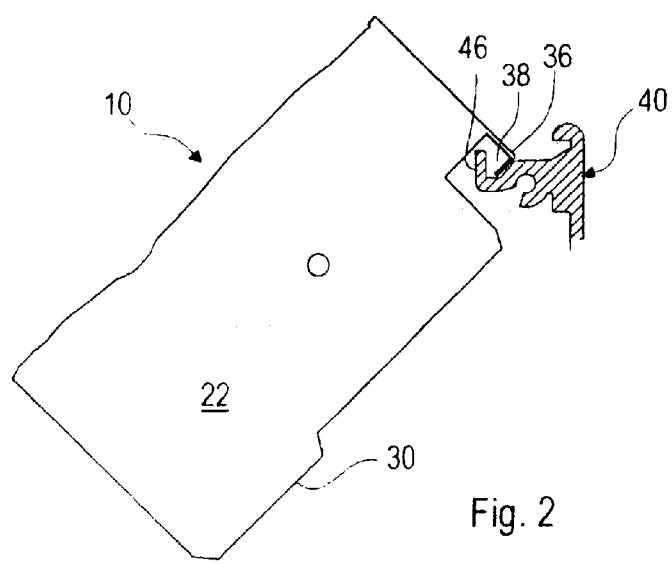
Figure 3:
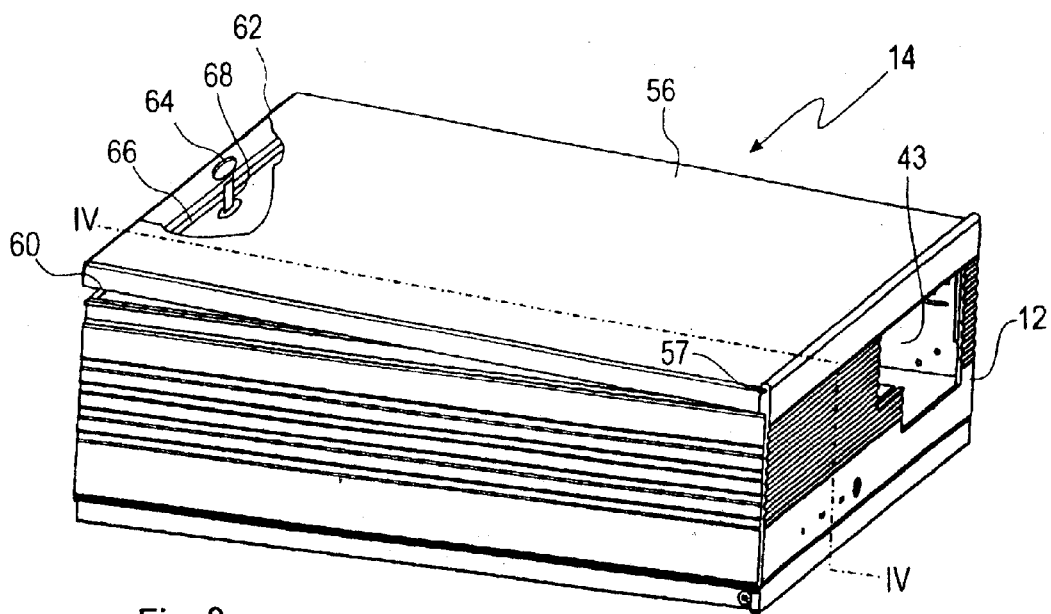
Figure 4:
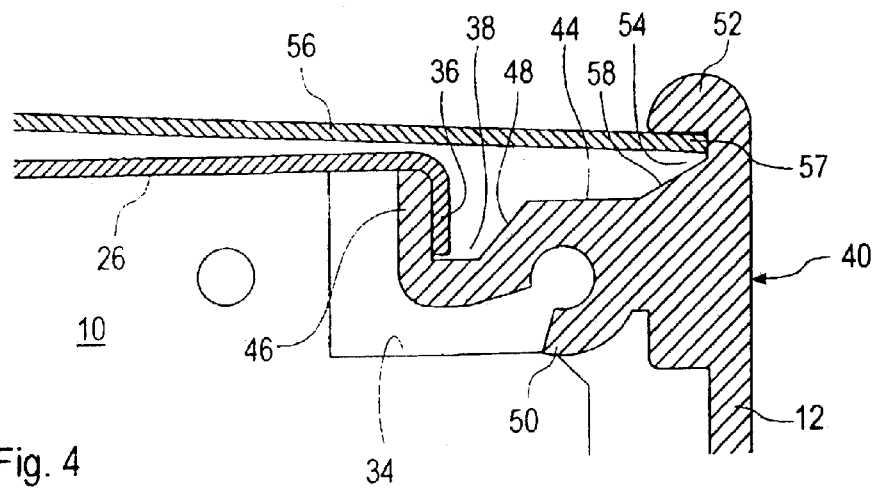
Figure 5:
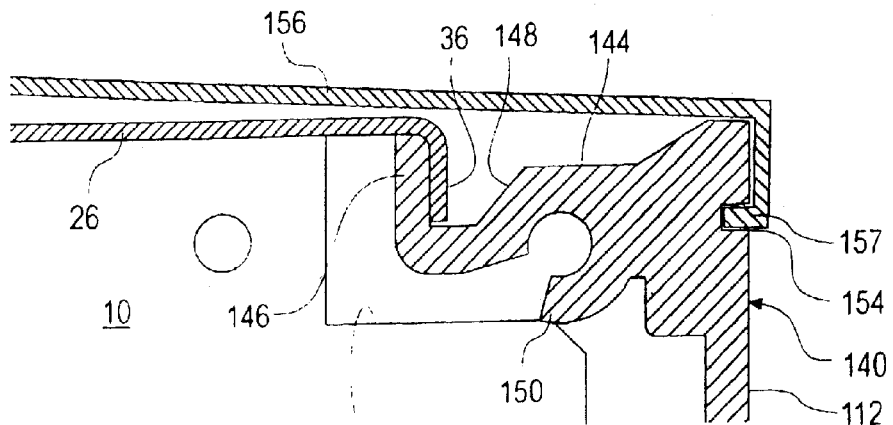

Further features and advantages of the invention can be gathered from the following description of two exemplary embodiments which are explained, with reference to the attached drawing, in which:

FIG. 1 shows a side view of a subassembly which is suspended on the front wall of a first exemplary embodiment of a housing, FIG. 2 shows a view of part of the arrangement from FIG. 1 in an intermediate installation position, FIG. 3 shows a perspective plan view of a housing according to the first exemplary embodiment, FIG. 4 shows a view, in section, through part of the housing along section line IV—IV in FIG. 3, and FIG. 5 shows a side view, in section, of part of a subassembly which is suspended on a front wall of a second exemplary embodiment of a housing.

FIG. 1 shows a side view of a subassembly 10 which is suspended on the front wall 12, illustrated in section, of a first exemplary embodiment of a housing 14 (FIG. 3). The subassembly 10 comprises an installation cage 16 with an upside-down U-shaped cross-sectional profile in which a peripheral device 18 or 18' is installed. The peripheral device may be, for example, a CD drive 18 which comprises a control panel 20 which is to be operated from outside the housing 14 and has operating elements which are known and have thus not been illustrated. Beneath the CD drive 18 there is sufficient space, for example, for a floppy-disk drive. However, it is also possible for the peripheral device to be a hard-disk drive 18' which does not have any control panel to be operated from outside the housing 14 and may thus be installed further to the rear of the installation cage 16.

In the state in which the installation cage 16 is installed in the housing 14, the side walls 22 (only the left-hand side wall can be seen in FIG. 1) of said installation cage are aligned perpendicularly to the front wall 12 of the housing 14. They are provided with through-passage holes 24 for screws (not illustrated) which retain the peripheral device 18, 18' in the installation cage 16. The side walls 22 are connected at the top by a central panel 26. A supporting element 30 is integrally formed on the edge 28 of each side wall 22, said edge being directed toward the front wall 12, at the end which is remote from the central panel 26. At the end which is in the vicinity of the central panel 26, each side wall 22 has a rectangular cutout 32, of which the upwardly oriented edge 34 runs parallel to the central panel 26. The central panel 26 projects beyond the cutout 32 and, in the region of the latter, is bent down at right angles in the direction thereof, this producing a hook-like supporting element 36 with a channel 38 which is open at the bottom.

The front wall 12 of the housing 14 is continuously cast from light metal. A head part 40 is formed at the top border of the front wall 12 and a foot part 42 is formed at the bottom border of the same. In the region of the control panel 20, the front wall 12 is provided with a through-passage 43, of which the clear dimensions are adapted to the outer dimensions of the control panel 20.

The head part 40 has a protrusion 44 which is oriented toward the housing interior and at the end of which there is formed a mounting edge 46 which is oriented upward in a hook-like manner. An introduction slope 48 runs parallel to, and at a distance from, the mounting edge 46. A boundary rib 50, which likewise runs parallel to the mounting edge 46, is integrally formed on the underside of the head part 40. The head part 40 has projecting beyond it a retaining rib 52 which runs parallel to the mounting edge 46 and bounds in the upward direction an accommodating groove 54 for a first edge 57 of a cover panel 56. The accommodating groove 54 is bounded in the downward direction by a second introduction slope 58.

FIG. 3 shows a perspective plan view of the housing 14. The housing 14 is cuboidal with a top opening 60 which can be closed by the cover panel 56.

At its second edge 62, which is remote from the first edge 57, the cover panel 56 is provided with a first locking element 64, which interacts with a second locking element 68, which is installed in the rear wall 66 of the housing 14. Locking means for covers, shutters and doors are known in a wide variety of embodiments. The locking means used here may be adjustable in a known manner by a handle or by a key.

The task of installing the subassembly 10 in the housing 14 is described hereinbelow. First of all, the cover panel 56 is removed from the housing 14 in order to expose the opening 60. As is shown in FIG. 2, the subassembly 10 is inclined downward through approximately 45° such that the supporting elements 30 are oriented obliquely in the downward direction. In this alignment, the subassembly 10 is introduced into the housing 14 from above and suspended on the mounting edge 46 by way of its mounting element 36. The introduction slope 48 here facilitates correct positioning. The subassembly 10 is then pivoted into the position shown in FIG. 1, until the supporting elements 30 butt against the front wall 12. In this case, the edge 34 of the cutout 32 interacts with the boundary rib 50 so that the mounting element 36 butts firmly against the mounting edge 46. The cover panel 56 is then pushed into the accommodating groove 54 from the rear by way of its first edge 57. As can be gathered from FIG. 4, it rests on the subassembly 10, with the result that its second edge 62 projects from the top edge of the rear wall 66 of the housing 14 (FIG. 3). If the cover panel 56 is then pressed down onto the housing 14 and locked to the rear wall 66, at least one of the following elements: mounting element 36, mounting edge 46 and cover panel 56 deforms elastically. Between the front wall 12 and the cover panel 56, on the one hand, and between the cover panel 56 and the subassembly 10, on the other hand, there is thus a constant contact pressure which ensures reliable electrical connection between these components. At the same time, the subassembly is fixed in its position.

FIG. 5 shows a partial view, in section, corresponding to FIG. 4, in the case of which the subassembly 10 is suspended on a front wall 112 of a second exemplary embodiment of a housing. A head part 140 is formed at the top border of the front wall 112 and a foot part is formed at the bottom border of the same, this foot part corresponding to the foot part 42 in FIG. 1 and thus not being illustrated here.

The head part 140 has a protrusion 144 which is oriented toward the housing interior and at the end of which there is formed a mounting edge 146 which is oriented upward in a hook-like manner. Here too, an introduction slope 148 runs parallel to, and at a distance from, the mounting edge 146. A boundary rib 150, which likewise runs parallel to the mounting edge 146, is integrally formed on the underside of the head part 140. An accommodating groove 154, which runs parallel to the mounting edge 146 and is intended for a first edge 157 of a cover panel 156, is formed on the outside of the front wall 112, in the region of the head part 140.

The first edge 157 of the cover panel 156 is bent back downward at right angles and then in the direction of the subassembly 10. Otherwise, the cover panel 156 corresponds to the cover panel 56 of the first exemplary embodiment.

The subassembly 10 is installed as has been described above, it being suspended on the mounting edge 146 by way of its mounting element 36. The cover panel 156 is pushed onto the housing 14 from the front, until it engages in the accommodating groove 154 by way of its first edge 157. In this case, it rests, like the cover panel 56 of the first exemplary embodiment and as is illustrated in FIG. 5, on the subassembly 10, with the result that its second edge projects from the top edge of the rear wall 66 of the housing 14 (FIG. 3). The cover panel 156 is then pressed down onto the housing 14 and locked to the rear wall 66. The arrangement according to the second exemplary embodiment has the advantage that the top side of the device arrangement is completely smooth.

What is claimed is:

1. A device arrangement comprising:
   a housing (14), with an opening (60) and a cover panel (56, 156) for closing the opening, and
   a subassembly (10) which is retained in a releasable manner in the housing (14) on an installation wall (12, 112), the subassembly (10) being suspended on the installation wall (12, 112) by means of a hook-like mounting element (36) and being retained in its position by the cover panel (56, 156), the cover panel (56, 156) and the housing (14) each having at least a sub-region comprised of an electrically conductive or conductively coated material, and, in the above-mentioned retained position of the subassembly in the housing, an electrical connection being produced between the subassembly (10) and the housing (14) with the aid of the cover panel (56, 156),
   the installation wall (12, 112) having a mounting edge (46, 146) in the vicinity of the opening (60),
   in the retained condition of the subassembly (10) the mounting element (36) being provided on a side of the subassembly (10) which is directed toward the installation wall (12, 112), with the installation wall (12, 112) having a channel (38) which receives the mounting edge (46, 146),
   there being arranged on the subassembly (10), beneath the mounting element (36), a supporting element (30) which, in the retained position of the subassembly (10), butts against the installation wall (12, 112), and
   the cover panel (56, 156) in a closed position relative to the housing in which it closes the opening (60) subjecting the subassembly (10) to an elastic pressure-exerting torque which presses the supporting element (30) against the installation wall (12, 112).

2. The device arrangement as claimed in claim 1, wherein:
   the electrical connection between the subassembly (10) and the housing (14) is produced by the elastic pressure-exerting torque of the cover panel (56, 156).

3. The device arrangement as claimed in claim 1, wherein:
   a first edge (57, 157) of the cover panel (56, 156) is retained at a top border of the installation wall (12,112).

4. The device arrangement as claimed in claim 3, wherein:
   the first edge (57, 157) of the cover panel (56, 156) in the closed position of the cover panel is plugged beneath a retaining rib (52), which runs parallel to the mounting edge (46, 146), or into a groove (54, 154), which runs parallel to the mounting edge (46, 146).

5. The device arrangement as claimed in 1, wherein:
   the cover panel (56; 156) rests on an adjacent surface (26) of the subassembly (10) at least in a region which is remote from the mounting element (36), such that its second edge (62), which is located opposite the first edge (57; 157), projects from the housing (14),
   by virtue of the second edge (62) being pressed down onto the housing (14) in the closed position of the cover panel, the mounting edge (46; 146) and/or the mounting element (36) are/is elastically deformed such that the cover panel (56; 156) subjects the subassembly (10) to an elastic pressure-exerting torque, and, in said closed position of the cover panel, the cover panel (56, 156) can be locked to the housing (14).

6. The device arrangement as claimed in claim 1, wherein:
   the subassembly (10) comprises an installation cage (16) in which at least one peripheral device (18, 18') can be installed, and
   the mounting edge (36) and/or the supporting element (30) are/is fitted on the installation cage (16).

7. The device arrangement as claimed in 1, wherein:
   the installation wall is a side wall of the housing.

8. The device arrangement as claimed in claim 7, wherein:
   a peripheral device (18) with a control panel (20) which is to be operated from outside the housing (14) is installed in the installation cage (16) such that the control panel (20) projects beyond the supporting element (30) in the direction of the side wall, and a through-passage (43) serving for accommodating the control panel (20) is formed in the side wall.

9. The device arrangement as claimed in claim 1, wherein:
   the installation wall (12, 112) is produced from a continuously cast profile.

* * * * *